(12) United States Patent
Maekawa et al.

(10) Patent No.: US 7,939,405 B2
(45) Date of Patent: May 10, 2011

(54) METHOD OF MANUFACTURING SEMICONDUCTOR DEVICE HAVING CYLINDER-TYPE CAPACITOR STRUCTURE

(75) Inventors: Atsushi Maekawa, Tokyo (JP); Yoshitaka Nakamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 192 days.

(21) Appl. No.: 12/194,040

(22) Filed: Aug. 19, 2008

(65) Prior Publication Data

US 2009/0061589 A1    Mar. 5, 2009

(30) Foreign Application Priority Data

Aug. 29, 2007    (JP) ................................. 2007-222932

(51) Int. Cl.
*H01L 21/8242* (2006.01)
(52) U.S. Cl. .............................. 438/256; 257/E21.649
(58) Field of Classification Search .................. 438/256
See application file for complete search history.

(56) References Cited

U.S. PATENT DOCUMENTS

| 6,399,399 B2 * | 6/2002 | Yamamoto ........................ 438/3 |
| 6,916,738 B2 * | 7/2005 | Lee et al. ...................... 438/639 |

FOREIGN PATENT DOCUMENTS

| JP | 2003-297952 | 10/2003 |
| JP | 2005-032982 | 2/2005 |

* cited by examiner

*Primary Examiner* — Chandra Chaudhari
(74) *Attorney, Agent, or Firm* — Scully, Scott, Murphy & Presser, PC

(57) ABSTRACT

A method of manufacturing a semiconductor device includes forming an inter-layer insulating film; arranging a plurality of grooves in a surface layer of the inter-layer insulating film; forming embedded insulating films which are embedded in the grooves; arranging a plurality of holes in the inter-layer insulating film and between the embedded insulating films, in a manner such that each hole between the embedded insulating films partially overlaps therewith; forming lower electrodes, each of which has a bottom and a side face, and covers the bottom and side faces of the corresponding hole; forming a capacitance insulating film which covers the lower electrodes; and forming an upper electrode which further covers the capacitance insulating film.

6 Claims, 12 Drawing Sheets

METHOD OF MANUFACTURING SEMICONDUCTOR DEVICE HAVING CYLINDER-TYPE CAPACITOR STRUCTURE

BACKGROUND OF THE INVENTION

1. Field of the Invention

The present invention relates to a method of manufacturing a semiconductor device having a cylinder-type capacitor structure.

Priority is claimed on Japanese Patent Application No. 2007-222932, filed Aug. 29, 2007, the contents of which are incorporated herein by reference.

2. Description of Related Art

In semiconductor devices such as a DRAM (dynamic random access memory) or the like, finer memory cells have been formed in accordance with progress in fine processing techniques, and the amount of charge stored in a capacitor, which forms each memory cell, has been decreased.

More specifically, the finer the memory cell of a DRAM, the smaller the occupied area of the relevant capacitor. In order to obtain a specific capacity (of the capacitor) in the limited occupied area, the capacitor must have a three-dimensional electrode structure, so as to increase the surface area of the electrodes.

In consideration of the above, a cylinder-type capacitor structure has been proposed, which has (i) a plurality of cylinder holes formed in an inter-layer insulating film, (ii) a lower electrode which has a pipe form having a bottom, and is formed so as to cover the bottom and side faces of each cylinder hole, (iii) a capacitance insulating film which covers the inter-layer insulating film and the lower electrodes, and (iv) an upper electrode which covers the capacitance insulating film. In this cylinder-type capacitor structure, the surface area of the electrodes is increased by increasing the ratio (called an "aspect ratios") of the height to the bottom surface of each of the lower electrodes which are arranged at regular intervals.

When forming such a cylinder-type capacitor structure, as shown in FIGS. 12A and 12B, an inter-layer insulating film 101 is formed, and a plurality of cylinder holes 102 are arranged by means of dry etching, where the cylinder holes 102 pass through the inter-layer insulating film 101, and are positioned immediately on contact pads 202 which are exposed through the openings formed in a cylinder stopper 201 provided for selection transistors.

If memory cells have a finer form, each signal cylinder hole 102, which has a high aspect ratio, has a bowing shape in which a part in the vicinity of the corresponding opening 102a is widened like a barrel. Such a bowing shape is unavoidable with regard to dry etching, and is the most difficult element to control in consideration of the progress of fine processing. That is, when the capacitor structure has a finer form, it is difficult to provide a specific distance between separate cylinder holes which are arranged at regular intervals, and to control the short margin of the lower electrode formed in each cylinder hole 102.

Additionally, in order to form the above-described cylinder-type capacitor structure, as shown in FIG. 13, after a lower electrode 103, which has a pipe form having the bottom so as to cover the bottom and side faces of each cylinder hole 102, is formed, the inter-layer insulating film 101 is removed by means of wet processing. However, each lower electrode 103 having the above-described shape tends to fall during the wet processing, and if it falls or breaks, a short circuit or breakage occurs between the relevant electrodes, which causes a short capacitance or an operational default.

In consideration of the above, the lower electrodes, which are arranged at regular intervals, are coupled with each other via insulating films, so as to prevent the lower electrodes from falling (see, for example, Patent Documents 1 and 2). However, the present inventors have recognized that Patent Documents 1 and 2 disclose or indicate no technique for reducing a bowing shape of each cylinder hole 102 when it is formed.
Patent Document 1: Japanese Unexamined Patent Application, First Publication No. 2003-297952.
Patent Document 1: Japanese Unexamined Patent Application, First Publication No. 2005-32982.

SUMMARY

The present invention seeks to solve one or more of the above problems, or to improve upon those problems at least in part.

In one embodiment, there is provided a method of manufacturing a semiconductor device, and the method includes forming an inter-layer insulating film; arranging a plurality of grooves in a surface layer of the inter-layer insulating film; forming embedded insulating films which are embedded in the grooves; arranging a plurality of holes in the inter-layer insulating film and between the embedded insulating films, in a manner such that each hole between the embedded insulating films partially overlaps therewith; forming lower electrodes, each of which has a bottom and a side face, and covers the bottom and side faces of the corresponding hole; forming a capacitance insulating film which covers the lower electrodes; and forming an upper electrode which further covers the capacitance insulating film.

In a typical example, the holes are cylinder holes, each having a cylinder shape and the lower electrodes has a pipe shape having the bottom.

In the above method, when the holes are formed in the inter-layer insulating film, the embedded insulating films, which are embedded in the inter-layer insulating film, can prevent each hole from having a bowing shape. In addition, when removing the inter-layer insulating film, the embedded insulating films, which couple the lower electrodes with each other, can prevent each lower electrode from falling. Furthermore, after the inter-layer insulating film is removed, the inner and outer surfaces of each lower electrode can function as the electrode, thereby further increasing the capacity of the capacitor.

BRIEF DESCRIPTION OF THE DRAWINGS

The above features and advantages of the present invention will be more apparent from the following description of certain preferred embodiments taken in conjunction with the accompanying drawings, in which:

FIG. 2A is a plan view, and FIG. 2B is a sectional view along line X-X'.

FIG. 3A is a plan view, and FIG. 3B is a sectional view along line X-X'.

FIG. 4A is a plan view, and FIG. 4B is a sectional view along line X-X'.

FIG. 5A is a plan view, and FIG. 5B is a sectional view along line X-X'.

FIG. 6A is a plan view, and FIG. 6B is a sectional view along line X-X'.

FIG. 7A is a plan view, and FIG. 7B is a sectional view along line X-X'.

FIG. 12A is a plan view, and FIG. 12B is a sectional view along line Y-Y'.

DETAILED DESCRIPTION OF PREFERRED EMBODIMENTS

Figure 1:
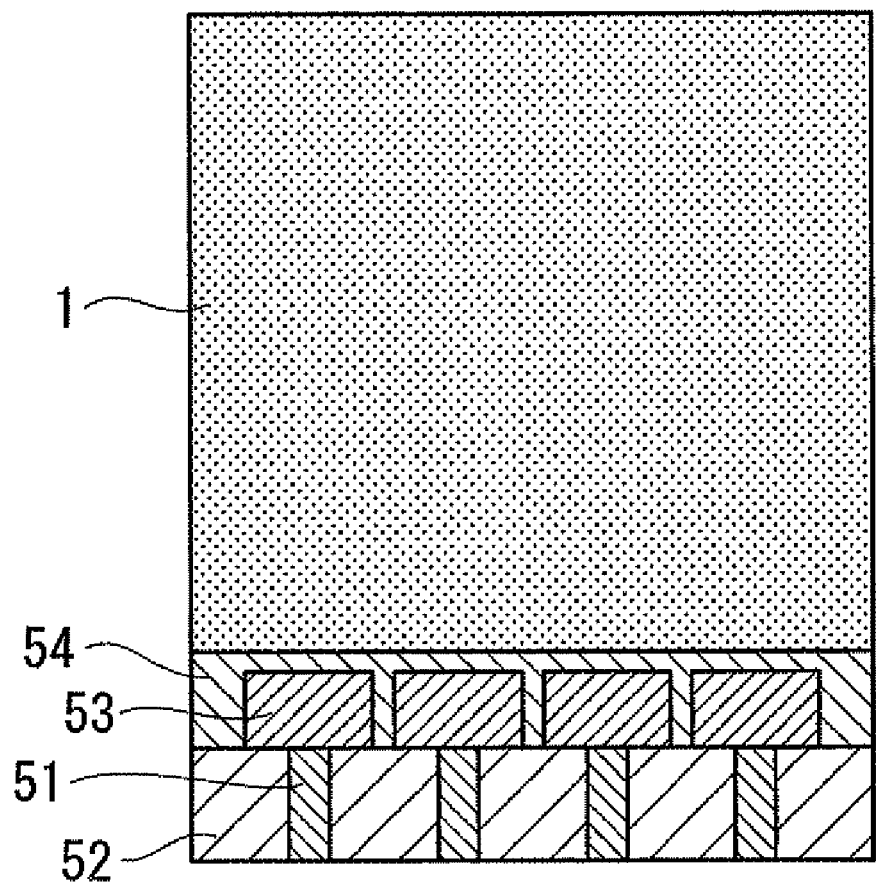
FIG. 1 is a sectional view showing one of manufacturing processes for manufacturing a semiconductor device, to which the present invention is applied, and specifically shows a state in which an inter-layer insulating film is formed.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

In the drawings referred to in the following explanations, distinctive parts may be enlarged so as to show them in an easily understandable manner. Therefore, each dimensional ratio between the relevant structural elements does not always coincide with the actual ratio. In addition, materials, dimensions, and the like in the explanations are just examples.

Semiconductor devices, which can be manufactured in accordance with the present invention, may have a cylinder-type capacitor structure, which may be used in a capacitor (for storing capacitance) which forms a memory cell of a DRAM.

A DRAM is generally formed by a memory-cell part and a peripheral circuit part, which are provided on a semiconductor substrate. In the memory-cell part, a plurality of memory cells are arranged, where each memory cell has a selection transistor (MISFET) and a capacitor structure which is connected to the source and drain of the selection transistor via contact plugs. In the peripheral circuit part, a plurality of transistors for peripheral circuits are arranged at the periphery of the memory-cell part.

The semiconductor device manufacture method in accordance with the present invention can be preferably employed when a capacitor structure (which forms a memory cell in a DRAM) is formed on a selection transistor.

Referring now to FIG. 1, when forming a cylinder-type capacitor structure on a selection transistor by using the manufacturing method as a first embodiment of the present invention, an inter-layer insulating film 1 made of a silicon oxide film is formed on selection transistors. Below the inter-layer insulating film 1, a plurality of contact plugs 51 made of polysilicon are arranged, which are embedded in an inter-layer insulating film 52, and are connected to the relevant sources and drains of the selection transistors. On each contact plug 51 which is exposed through the inter-layer insulating film 52, a contact pad 53 made of polysilicon is provided. A cylinder stopper 54 made of a silicon nitride film covers the surface of the inter-layer insulating film 52, on which the contact pads 53 are formed.

The structure of the selection transistor formed under each capacitor structure is not particularly limited, and may be formed using a known method. In addition, in a concrete example which was actually performed, each contact pad 53 had a thickness of approximately 75 nm. The cylinder stopper 54 had a thickness of approximately 50 nm, and in the concrete example, the relevant silicon nitride film was formed at 650° C. by means of reduced-pressure thermal CVD (chemical vapor deposition). The inter-layer insulating film 1 had a thickness of approximately 2000 nm.

Figure 2A:
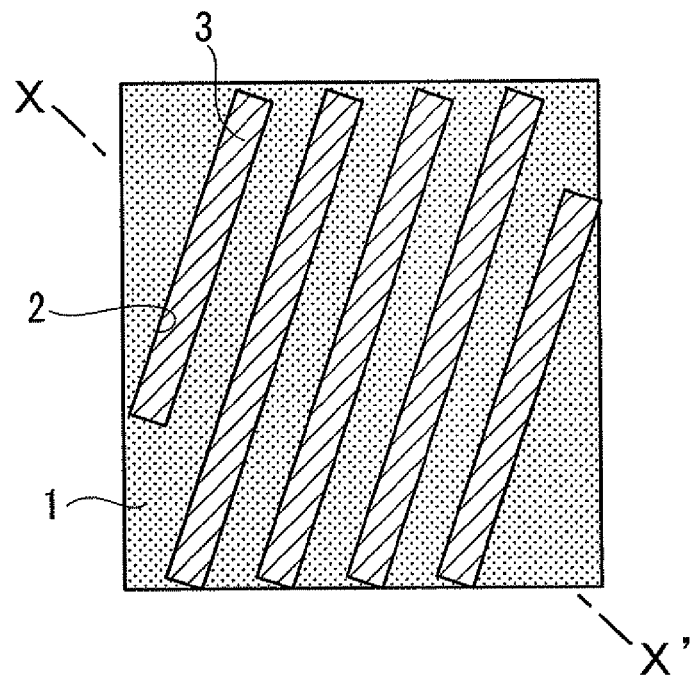
FIGS. 2A and 2B are diagrams which also show one of the manufacturing processes, and specifically show a state in which embedded insulating films embedded in grooves are formed, where
Figure 2B:
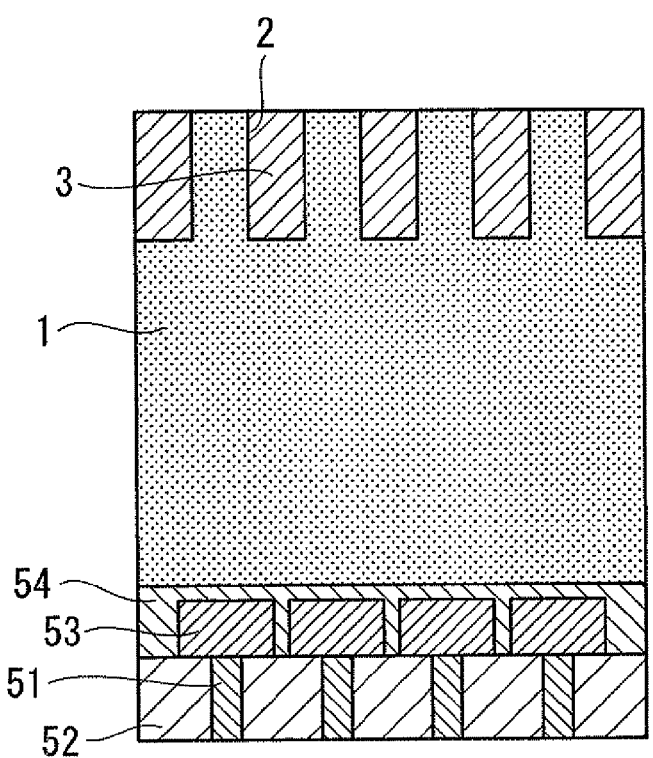

Next, as shown in FIGS. 2A and 2B, in a surface layer of the inter-layer insulating film 1, a plurality of line-shaped grooves 2 are arranged, and then embedded insulating films 3 are formed, which are embedded in the grooves 2.

The grooves 2 are formed by (i) forming a resist pattern on the inter-layer insulating film 1 by means of lithography, (ii) and subjecting the inter-layer insulating film 1 to patterning by means of dry etching which uses the resist pattern as a mask. In the concrete example, a parallel-plate plasma etching apparatus was used together with an etching gas of $C_4F_8$/$O_2$/Ar so that the grooves 2 having a depth of approximately 500 nm were formed.

Also in the concrete example, a silicon nitride film having a thickness of approximately 100 nm was formed by means of reduced-pressure CVD on the surface where the grooves 2 were provided, so that the silicon nitride film was embedded in the grooves 2. After that, the surface of the silicon nitride film was polished by means of CMP (chemical mechanical polishing) so that the surface would be planarized until the surface of the inter-layer insulating film 1 was exposed, thereby forming the embedded insulating films 3 (embedded in the grooves 2).

Figure 3A:
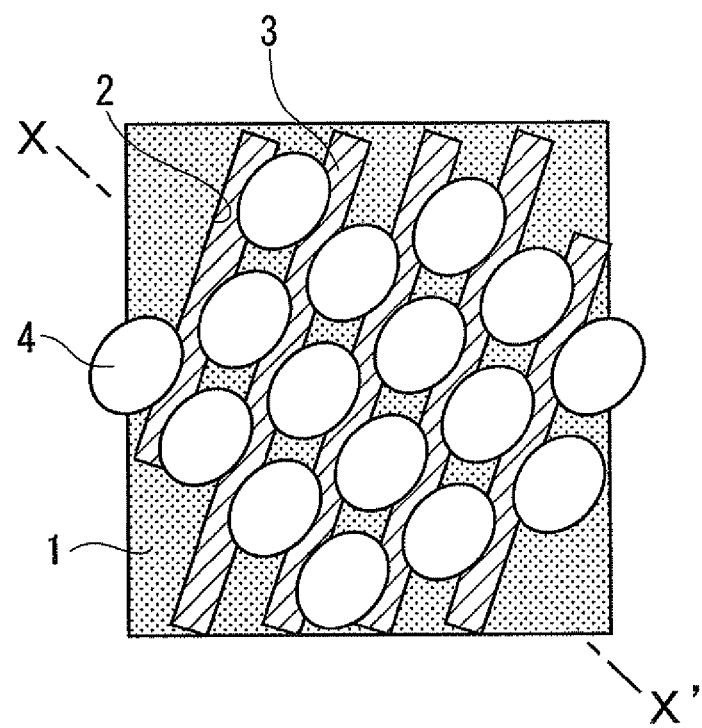
FIGS. 3A and 3B are diagrams which also show one of the manufacturing processes, and specifically show a state in which cylinder holes are formed, where
Figure 3B:
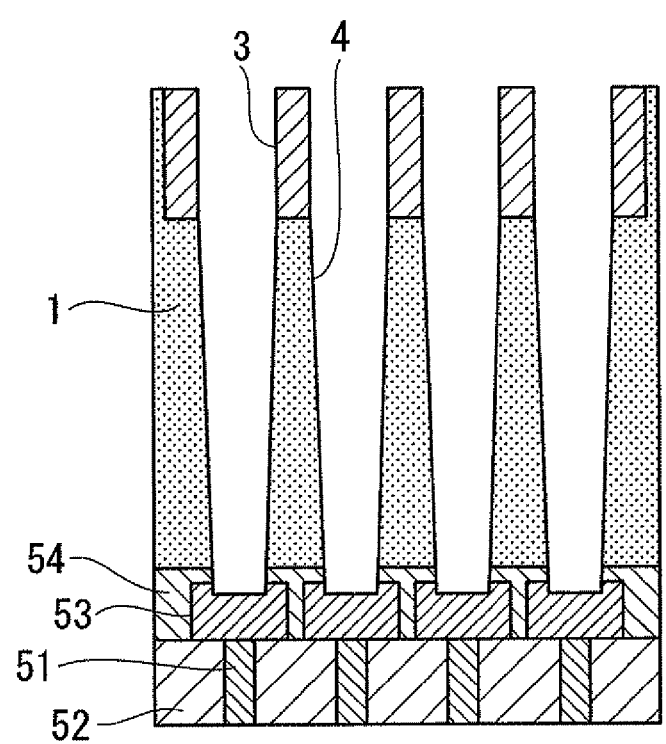

Next, as shown in FIGS. 3A and 3B, a plurality of cylinder holes 4 are arranged between the embedded insulating films 3, and each cylinder hole 4 between the relevant embedded insulating films 3 partially overlaps therewith.

More specifically, first, on the inter-layer insulating film 1, a resist pattern (not shown) having openings corresponding to the cylinder holes 4 is formed. The openings are positioned immediately on the contact pads 53 and between the parallel-arranged embedded insulating films 3, where each opening between the relevant embedded insulating films 3 partially overlaps therewith.

Next, the inter-layer insulating film 1 and the embedded insulating films 3, which are exposed through the above openings, are etched by means of a first anisotropic etching. In this process, the inter-layer insulating film 1 and the embedded insulating films 3, which are exposed through the above openings, are etched in the relevant depth direction at substantially the same etching rate by means of the first anisotropic etching.

After the etching for the embedded insulating films 3 (which are exposed through the openings) is completed, the inter-layer insulating film 1, which is also exposed through the openings, is further etched by means of a second anisotropic etching which has a larger selection rate for the inter-layer insulating film 1 in comparison with the first anisotropic etching. In this process, even though the inter-layer insulating film 1, which is exposed through the openings, is further etched in the depth direction by means of the second anisotropic etching, the side faces of the embedded insulating films 3, which face the relevant cylinder holes 4, are not etched, thereby preventing each cylinder hole 4 from having a bowing shape.

After the inter-layer insulating film 1 is etched until the cylinder stopper 54 is exposed, the cylinder stopper 54 is removed by means of etching, so that the contact pads 53 are exposed. Finally, the resist pattern is removed.

Accordingly, the cylinder holes 4 are formed immediately on the contact pads 53, where the cylinder holes 4 pass through the inter-layer insulating film 1, the embedded insulating films 3, and the cylinder stopper 54 in the thickness direction thereof.

In the concrete example, the relevant etching was performed using a parallel-plate plasma etching apparatus, in which the upper electrode thereof is operated at an RF (radio frequency) of 60 MHz and 3000 W; the lower electrode was operated at an RF of 2 MHz and 3500 W; the pressure was 30 mT; and the etching gas was $C_4F_6/O_2/Ar$ (50/50/1000 sccm).

In order to etch a first 500 nm by means of the first anisotropic etching (so as to etch the inter-layer insulating film 1 and the embedded insulating films 3 simultaneously), $CHF_3$ (50 sccm) was added to the etching gas.

After that, in order to obtain a higher selection rate for the inter-layer insulating film 1 when performing the second anisotropic etching, the above-described original condition was restored (i.e., $CHF_3$ is not used), and the inter-layer insulating film 1 was etched until the cylinder stopper 54 was exposed. In this process, the embedded insulating films 3 are present within a depth range of 300 to 400 nm, in which a bowing shape tends to appear. Therefore, the embedded insulating films 3 function as a stopper for preventing the cylinder holes 4 from having a bowing shape.

After that, the cylinder stopper 54 was subjected to plasma etching using a $CHF_3/O_2/Ar$ gas having a flow rate of 100/50/200 sccm, so that the contact pads 53 were exposed. The resist pattern was then removed.

Figure 4A:
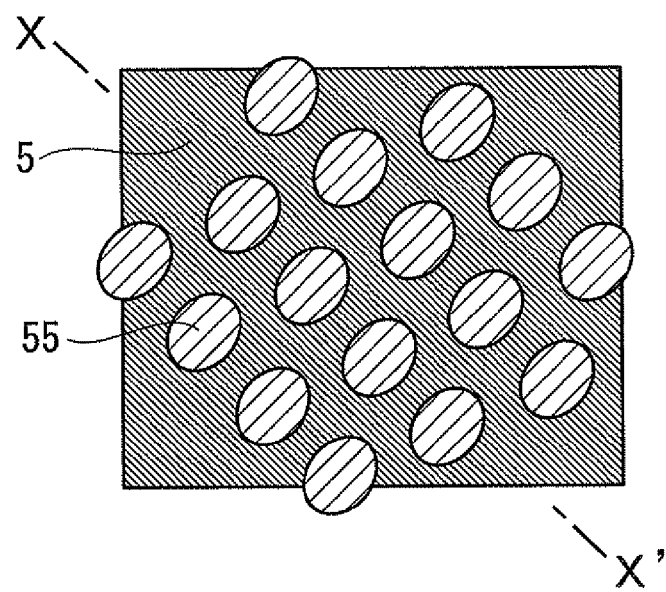
FIGS. 4A and 4B are diagrams which also show one of the manufacturing processes, and specifically show a resist material embedded in the lower electrodes, where
Figure 4B:
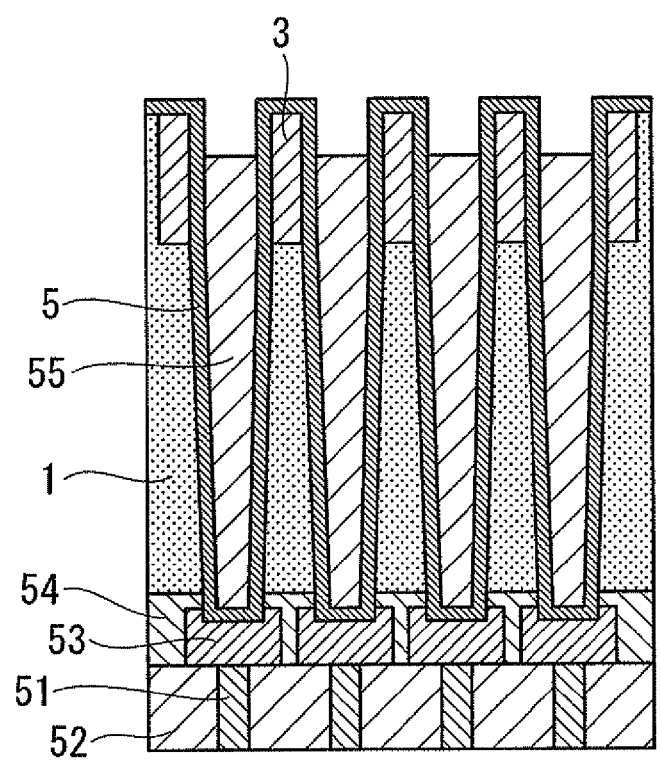

Next, as shown in FIGS. 4A and 4B, lower electrodes 5 are formed, where each lower electrode 5 has a pipe form having a bottom, so as to cover the bottom and side faces of the corresponding cylinder hole 4. In the concrete example, CVD was performed at a temperature of 650° C., by using (i) $TiCl_4$ and $H_2$ as reactive gases for forming a Ti film having a thickness of 10 nm, and (ii) $TiCl_4$ and $NH_3$ as reactive gases for forming a TiN film having a thickness of 15 nm, where the TiN film is stacked on the Ti film, so that the lower electrodes 5 were formed.

After that, a positive photosensitive resist material 55 is deposited thereon, so that it is embedded into the lower electrodes 5. Then, exposure and development are performed so as to remove an upper part of the resist material 55, where the upper part slightly enters the lower electrodes 5.

Figure 5A:
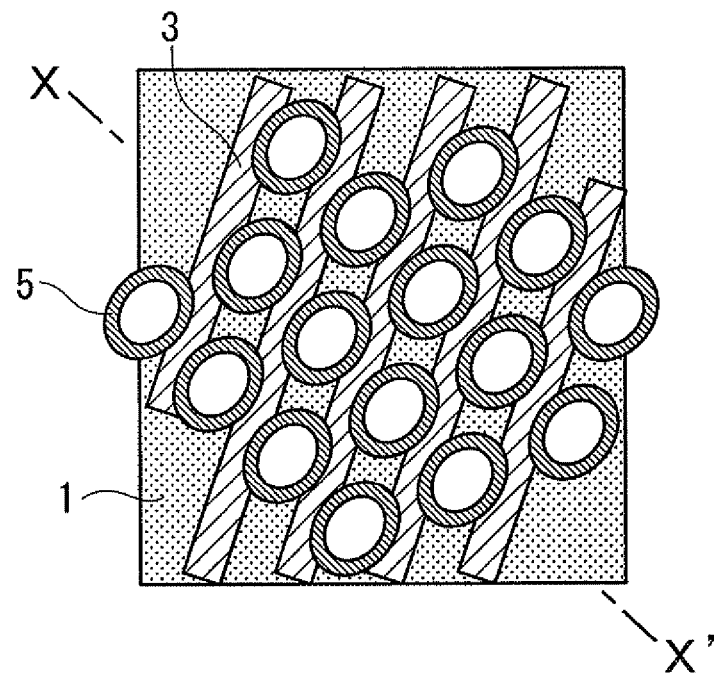
FIGS. 5A and 5B are diagrams which also show one of the manufacturing processes, and specifically show a state in which the lower electrodes are isolated from each other, where
Figure 5B:
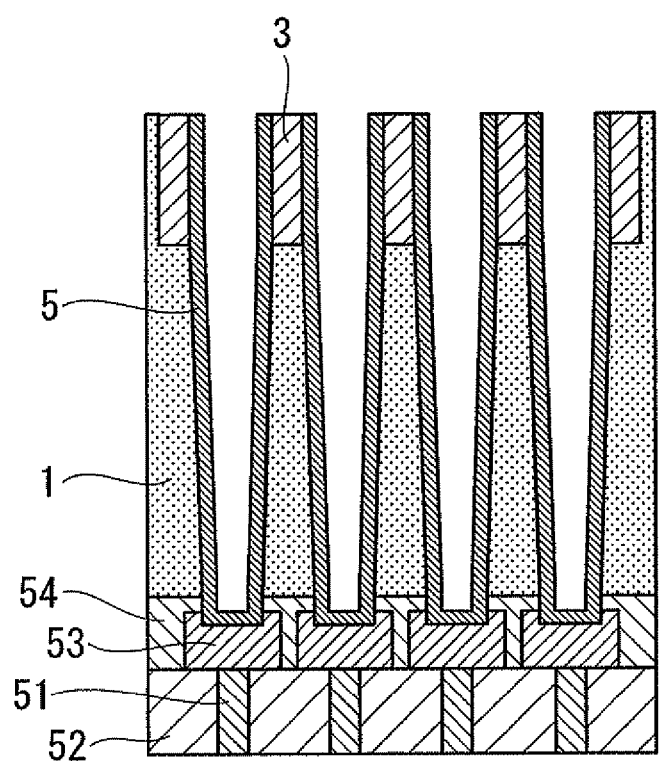

Next, as shown in FIGS. 5A and 5B, the lower electrodes 5 are isolated by means of etching, and then, the resist material 55 embedded in the lower electrodes 5 is removed. Accordingly, each lower electrode 5 is formed, which has a pipe form having a bottom, and covers the bottom and side faces of the corresponding cylinder hole 4. In the concrete example, etching was performed so as to isolate the lower electrodes 5, by using an ICP plasma etching apparatus, in which the upper electrode thereof was operated at an RF of 13.56 MHz and 600 W; the lower electrode was operated at an RE of 13.56 MHz: 50 W; the pressure was 100 mT; and the etching gas was $Cl_2$ (100 sccm). The resist material 55 was removed by means of plasma ashing using an ICP plasma ashing apparatus, in which the temperature was set to 150° C. and the ashing gas was $O_2$ (5000 sccm).

Figure 6A:
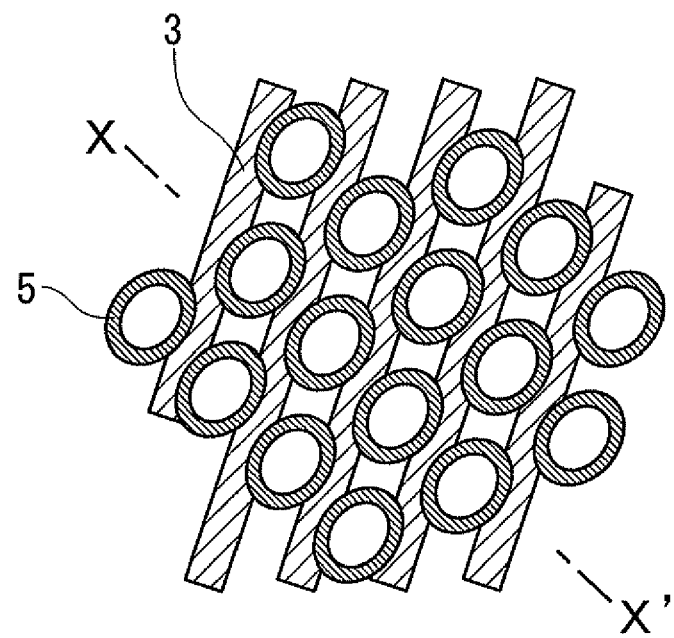
FIGS. 6A and 6B are diagrams which also show one of the manufacturing processes, and specifically show a state in which the inter-layer insulating film is removed, where
Figure 6B:
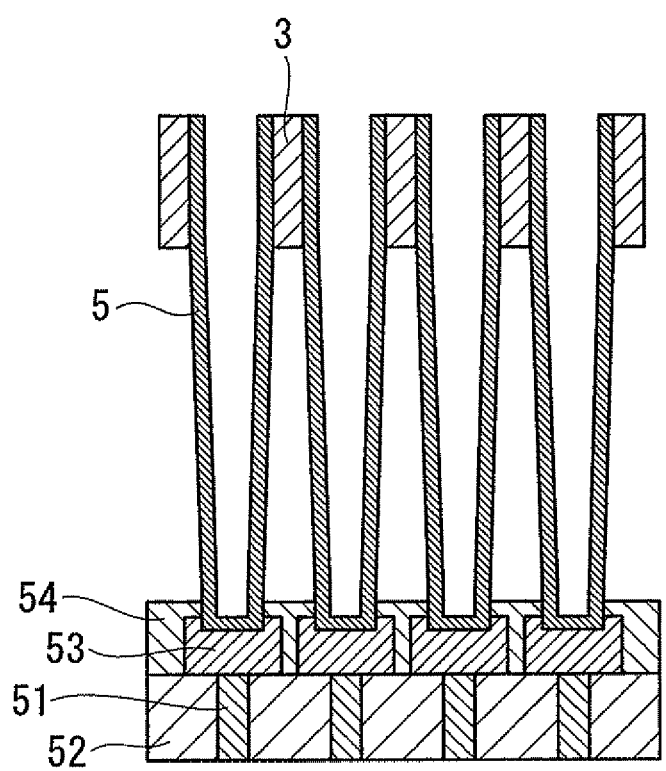

Next, as shown in FIGS. 6A and 6B, the inter-layer insulating film 1 is removed. In the concrete example, the inter-layer insulating film 1 was removed using an HF etchant for etching an oxide film. In this process, the selection ratio of etching of the silicon oxide film to the silicon nitride film is approximately 150, so that the inter-layer insulating film 1 can be selectively removed while the embedded insulating films 3 remain. In addition, any adjacent lower electrodes 2 are coupled via the embedded insulating film 3 with each other, so that the inter-layer insulating film 1 can be removed while preventing the lower electrodes 5 from falling or breaking due to the surface tension of the relevant etchant or washing water.

Figure 7A:
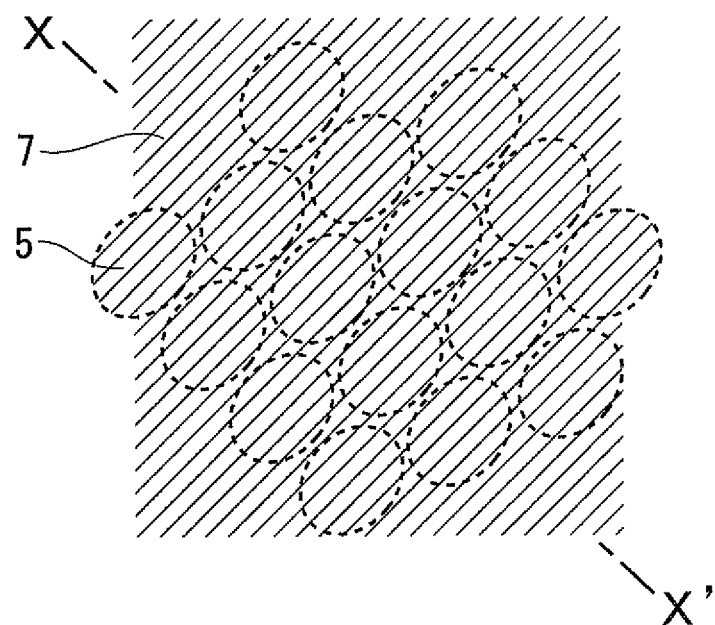
FIGS. 7A and 7B are diagrams which also show one of the manufacturing processes, and specifically show a state in which a capacitance insulating film and an upper electrode are formed, where
Figure 7B:
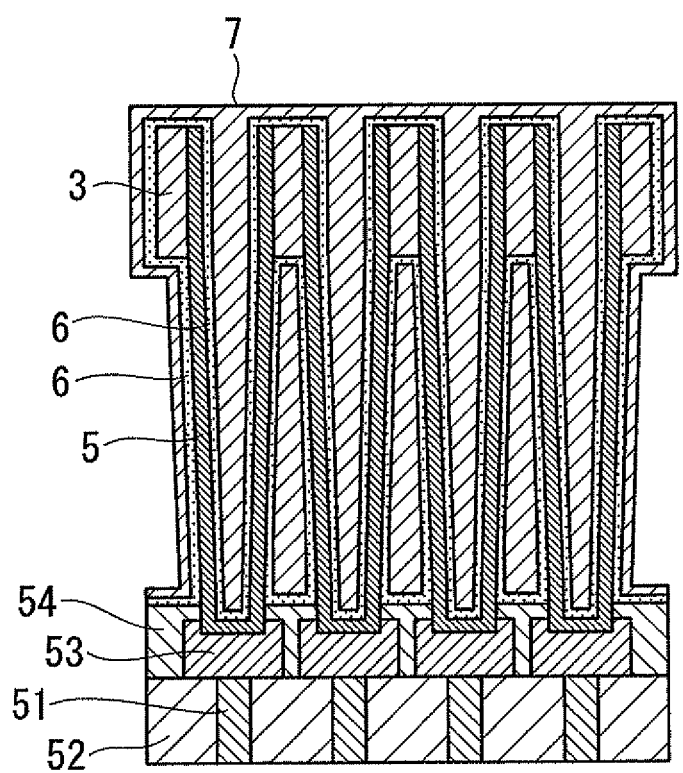

Next, as shown in FIGS. 7A and 7B, a capacitance insulating film 6 for covering the surface of the lower electrodes 5 is formed. In the concrete example, as the capacitance insulating film 6, an AlO film having a thickness of 8 nm was formed by means of ALD (atomic layer deposition) in which trimethyl aluminum and ozone were used as source gases, and the temperature was set to 300° C.

Next, an upper electrode 7 for covering the capacitance insulating film 6 is formed. In the concrete example, as the upper electrode 7, a TiN film having a thickness of 100 nm was formed by means of CVD. Accordingly, almost all the gaps at the inside and outside of the lower electrodes 5 are filled with the TiN film.

Figure 8:
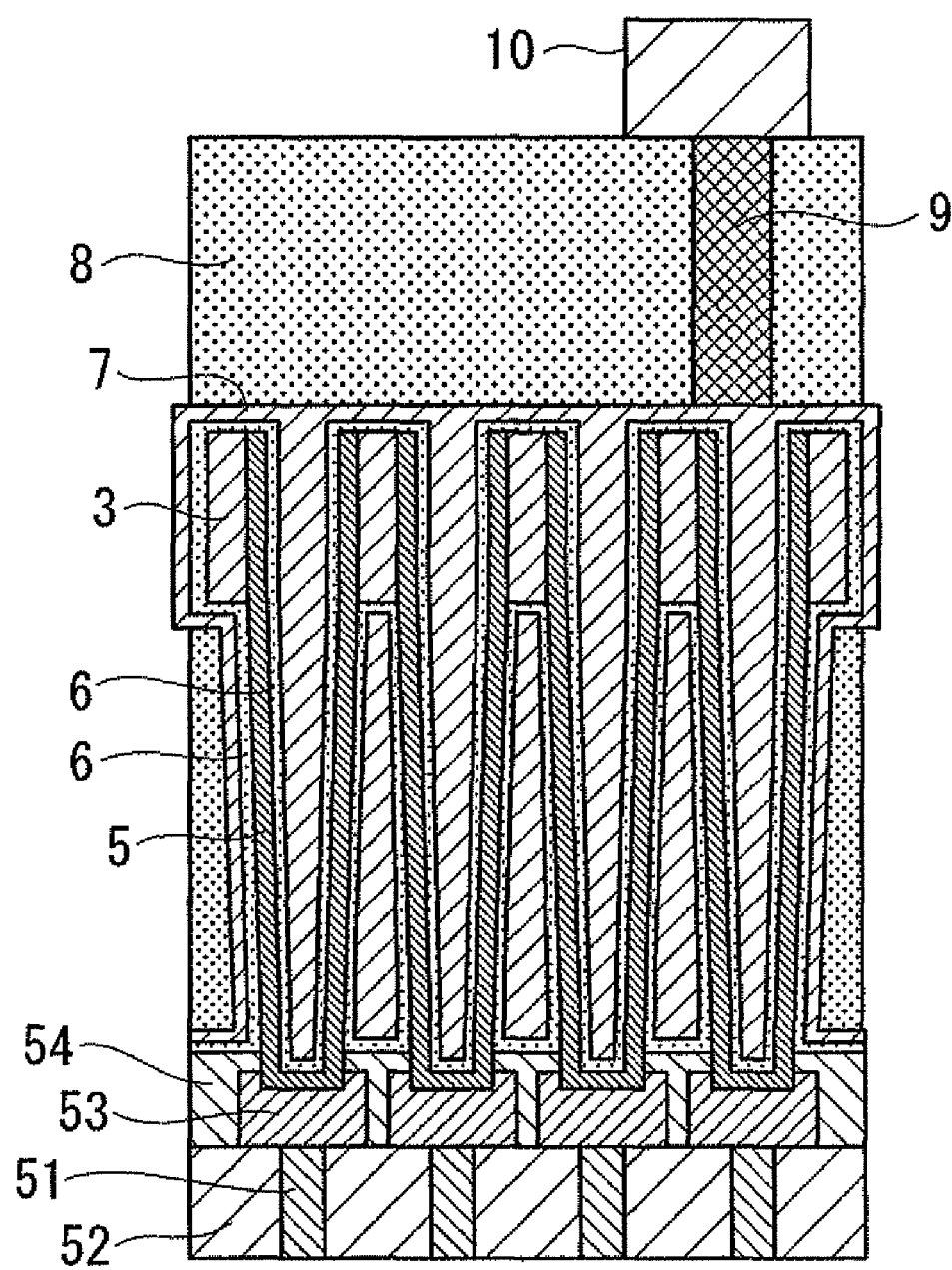
FIG. 8 is a sectional view which also shows one of the manufacturing processes, and specifically shows a state in which an inter-layer insulating film, a plug, and a wiring line are formed.

Finally, as shown in FIG. 8, an inter-layer oxide film 8 having a thickness of 500 nm is further deposited thereon, and a plug 9 made of W (tungsten) is formed on the upper electrode 7 by using a known method. In addition, a wiring line 10 made of Al is formed so that it is connected to the plug 9.

In accordance with the above-described processes, a cylinder-type capacitor structure can be formed. In this capacitor structure, as the inner and outer surfaces of each lower electrode 5 can be effectively used as the electrode, the capacity of the capacitor can be further increased.

As described above, in the present manufacturing method, when forming the cylinder holes 4 in the inter-layer insulating film 1, the embedded insulating films 3 (embedded in the inter-layer insulating film 1) can prevent the cylinder holes 4 from having a bowing shape. In addition, when removing the inter-layer insulating film 1, the embedded insulating films 3, which couple the lower electrodes 5 with each other, can prevent the lower electrodes 5 from falling. Therefore, in accordance with the present embodiment, a short circuit between capacitors, which may occur when a finer structure is required, can be prevented.

Additionally, as the inner and outer surfaces of each lower electrode 5 (from which the inter-layer insulating film 1 was removed) can function as the relevant electrode, the capacity of the capacitor can be further increased. In this case, the capacity can be doubled. If the capacity is not increased, the relevant depth can be reduced to halt so that it is possible to reduce the aspect ratio of the cylinder holes 4 formed in the inter-layer insulating film 1.

It is preferable to form the embedded insulating films 3 as lines arranged in parallel. In this case, when removing the inter-layer insulating film 1 by means of wet processing, the relevant etchant or washing water can easily enter through the gaps between the embedded insulating films 3 arranged as parallel lines. Also through the gaps, the capacitance insulating film 6 and the upper electrode 7 can be formed. In addition, when providing such gaps, patterning of the line-formed embedded insulating films 3 can be most easily performed.

Figure 9:
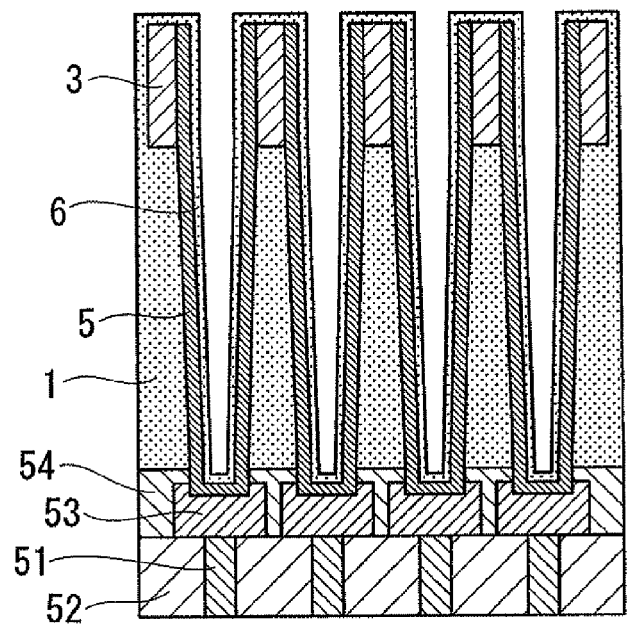
FIG. 9 is a sectional view showing one of manufacturing processes for manufacturing another semiconductor device, to which the present invention is applied, and specifically shows a state in which a capacitance insulating film is formed after lower electrodes are isolated from each other.
Figure 10:
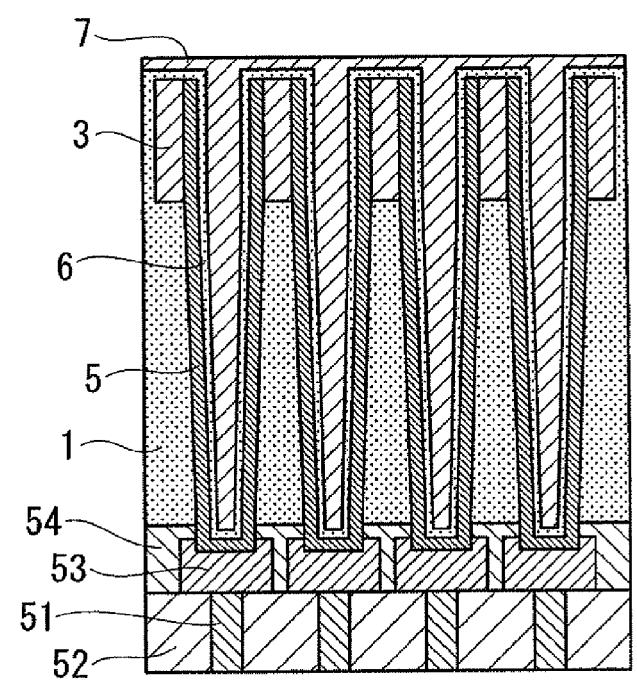
FIG. 10 is a sectional view which also shows one of the manufacturing processes of said another semiconductor device, and specifically shows a state in which an upper electrode is formed.
Figure 11:
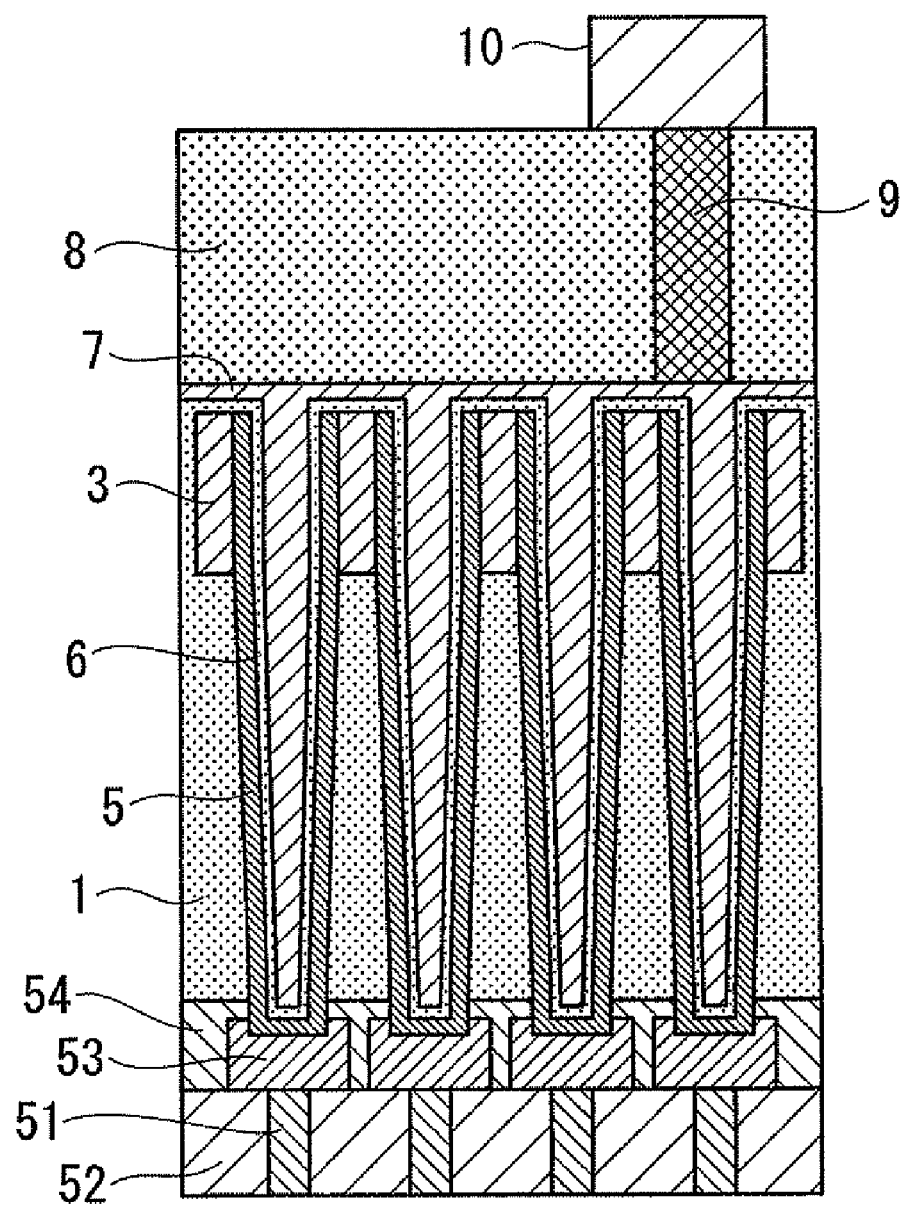
FIG. 11 is a sectional view which also shows one of the manufacturing processes of said another semiconductor device, and specifically shows a state in which an inter-layer insulating film, a plug, and a wiring line are formed.
Figure 12A:
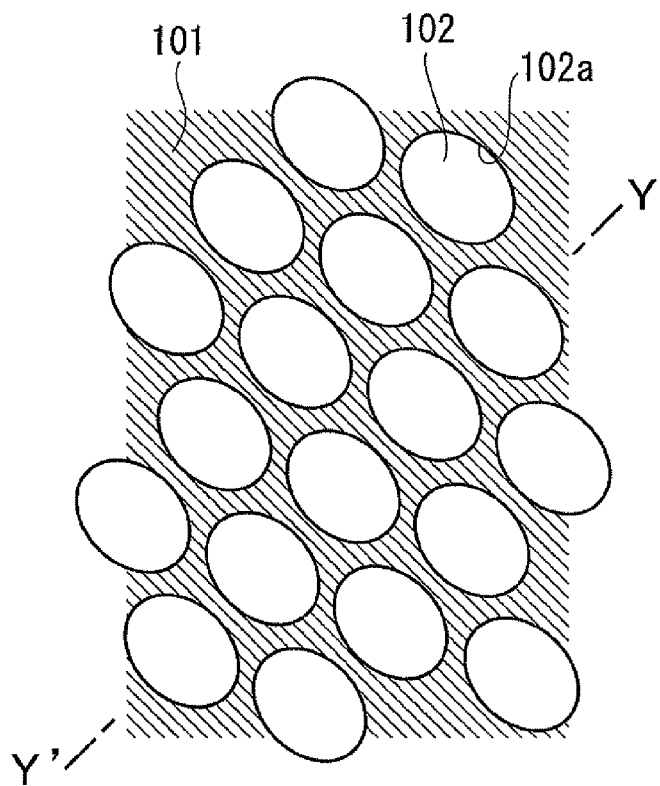
FIGS. 12A and 12B are diagrams which show a state in which cylinder holes, each having a bowing shape, are formed in one of conventional processes for manufacturing a semiconductor device, where
Figure 12B:
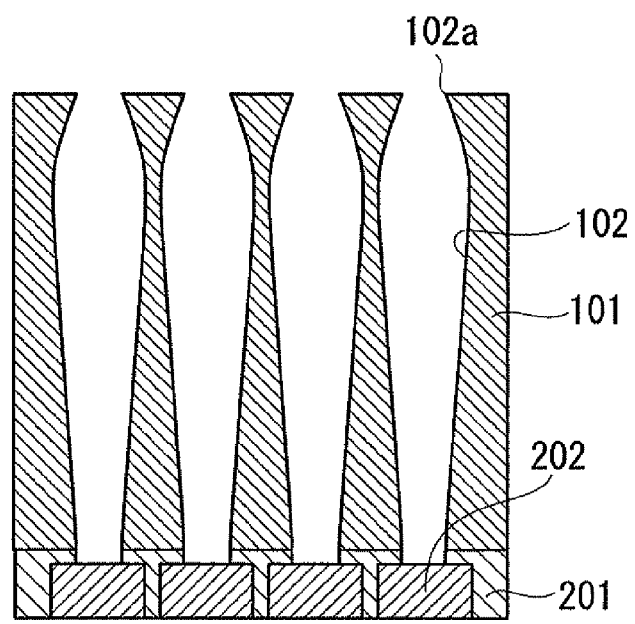
Figure 13:
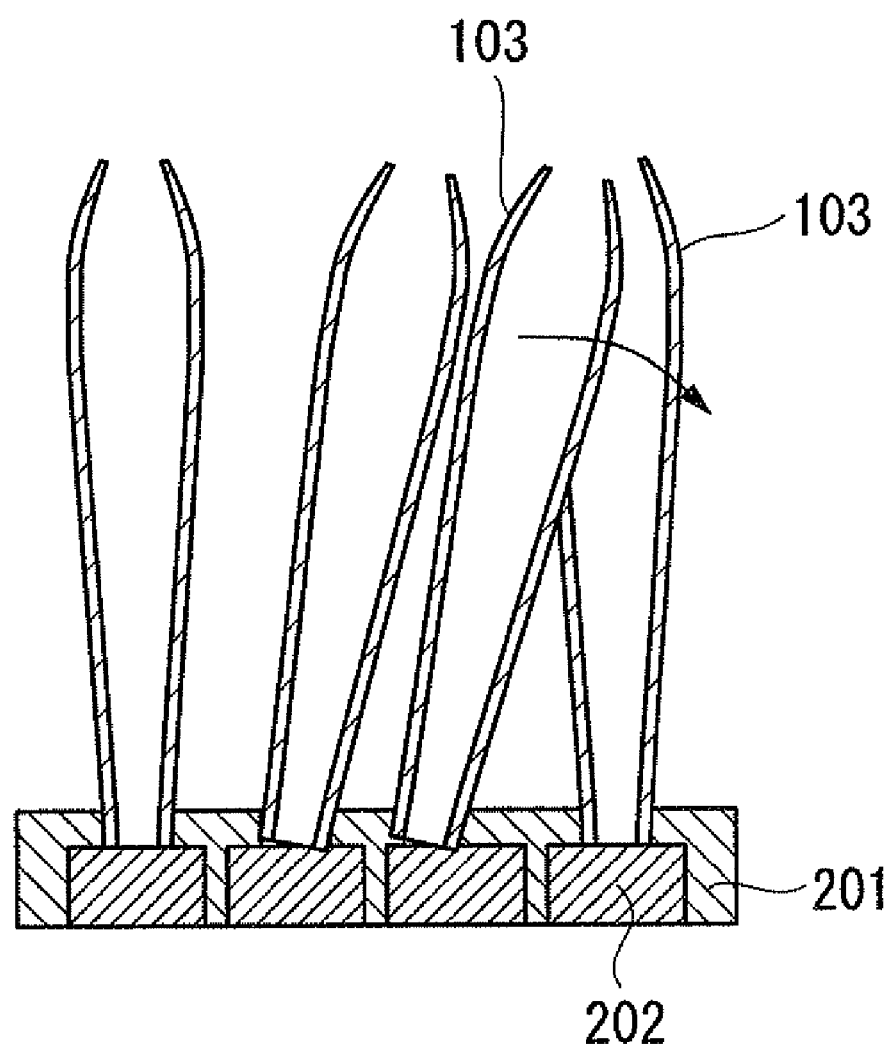
FIG. 13 is a sectional view which shows a state in which lower electrodes have fallen in one of the conventional processes.

In addition, the manufacturing method of the present invention is not always limited to the above embodiment. For example, as shown in FIG. 9, after the above-described lower electrodes 5 are isolated, a capacitance insulating film 6 for covering the surface of the lower electrodes 5 is formed. Next, as shown in FIG. 10, an upper electrode 7 is further deposited so as to cover the capacitance insulating film 6. Finally, as shown in FIG. 11, an inter-layer oxide film 8 is further deposited thereon, and a plug 9 is formed on the upper electrode 7. A wiring line 10, which is connected to the plug 9, is then formed.

In this case, only the inner surface of each lower electrode 5 is used as the electrode. The present invention can be applied when a semiconductor device having such a capacitor structure is manufactured.

In addition, even though the present invention can be preferably used for manufacturing a semiconductor device having a cylinder-type capacitor structure as described above, it also can be used when manufacturing a semiconductor device having a capacitor structure other than that of a capacitor type.

It is apparent that the present invention is not limited to the above embodiments, but may be modified and changed without departing from the scope and spirit of the invention.

What is claimed is:

1. A method of manufacturing a semiconductor device, the method comprising:
    forming an inter-layer insulating film;
    arranging a plurality of grooves in a surface layer of the inter-layer insulating film;
    forming embedded insulating films which are embedded in the grooves;
    arranging a plurality of holes in the inter-layer insulating film and between the embedded insulating films, in a manner such that each hole between the embedded insulating films partially overlaps therewith;
    forming lower electrodes, each of which has a bottom and a side face, and covers the bottom and side faces of the corresponding hole;
    forming a capacitance insulating film which covers the lower electrodes; and
    forming an upper electrode which further covers the capacitance insulating film, wherein the formation of the holes includes:
    forming a resist pattern on the inter-layer insulating film in which the embedded insulating films are formed, where the resist pattern has openings corresponding to the holes;
    etching the inter-layer insulating film and the embedded insulating films, which are exposed through the openings, by a first anisotropic etching which uses the resist pattern as a mask;
    further etching the exposed inter-layer insulating film by a second anisotropic etching after the etching of the exposed embedded insulating films is completed, where the second anisotropic etching has a higher etching rate for the inter-layer insulating film in comparison with the first anisotropic etching; and
    removing the resist pattern after the etching of the exposed inter-layer insulating film is completed.

2. The method in accordance with claim 1, further comprising:
    removing the inter-layer insulating film after the lower electrodes are formed.

3. The method in accordance with claim 1, wherein:
    the inter-layer insulating film is a silicon oxide film; and
    the embedded insulating films are silicon nitride films.

4. The method in accordance with claim 1, wherein:
    the holes are cylinder holes, each having a cylinder shape.

5. The method in accordance with claim 1, wherein:
    the lower electrodes has a pipe shape having the bottom.

6. The method in accordance with claim 1, wherein:
    the embedded insulating films have a parallel-line form.

* * * * *